United States Patent
Wu

[11] Patent Number: 5,837,588
[45] Date of Patent: Nov. 17, 1998

[54] METHOD FOR FORMING A SEMICONDUCTOR DEVICE WITH AN INVERSE-T GATE LIGHTLY-DOPED DRAIN STRUCTURE

[75] Inventor: Shye-Lin Wu, Hsinchu, Taiwan

[73] Assignee: Texas Instruments-Acer Incorporated, Hsinchu, Taiwan

[21] Appl. No.: 13,682

[22] Filed: Jan. 26, 1998

[51] Int. Cl.$^6$ .................................................. H01L 21/336
[52] U.S. Cl. .......................................... 438/305; 438/595
[58] Field of Search .................................. 438/303, 305, 438/595, 230, 231, 163, 204, 188; 257/344, 335, 336, 408

[56] References Cited

U.S. PATENT DOCUMENTS

| | | | |
|---|---|---|---|
| 4,818,715 | 4/1989 | Chao | 438/305 |
| 4,837,180 | 6/1989 | Chao | 438/305 |
| 4,906,589 | 3/1990 | Chao | 438/305 |
| 4,963,504 | 10/1990 | Huang | 438/305 |
| 4,984,042 | 1/1991 | Pfiester et al. | 257/344 |
| 5,015,598 | 5/1991 | Verhaar | 438/305 |
| 5,015,599 | 5/1991 | Verhaar | 438/305 |
| 5,032,535 | 7/1991 | Kamijo et al. | 438/305 |
| 5,053,849 | 10/1991 | Izawa et al. | 438/595 |
| 5,061,647 | 10/1991 | Roth et al. | 438/305 |
| 5,082,794 | 1/1992 | Pfiester et al. | 438/305 |
| 5,102,815 | 4/1992 | Sanchez | 438/305 |
| 5,120,673 | 6/1992 | Itoh | 438/305 |
| 5,147,814 | 9/1992 | Takeuchi | 438/305 |
| 5,158,903 | 10/1992 | Hori et al. | 438/305 |
| 5,162,884 | 11/1992 | Liou et al. | 257/344 |
| 5,175,119 | 12/1992 | Matsutani | 438/305 |
| 5,182,619 | 1/1993 | Pfiester | 257/344 |
| 5,202,277 | 4/1993 | Kameyama et al. | 438/305 |
| 5,238,859 | 8/1993 | Kamijo et al. | 438/305 |
| 5,241,203 | 8/1993 | Hsu et al. | 257/344 |
| 5,266,508 | 11/1993 | Azuma et al. | 438/305 |
| 5,302,536 | 4/1994 | Josquin | 438/595 |
| 5,304,504 | 4/1994 | Wei et al. | 438/305 |
| 5,314,832 | 5/1994 | Deleonibus | 438/305 |
| 5,427,971 | 6/1995 | Lee et al. | 438/595 |
| 5,476,801 | 12/1995 | Yamazaki et al. | 438/163 |
| 5,545,578 | 8/1996 | Park et al. | 438/305 |
| 5,568,418 | 10/1996 | Crisenza et al. | 257/314 |
| 5,576,574 | 11/1996 | Hong | 438/305 |
| 5,583,067 | 12/1996 | Sanchez | 438/305 |
| 5,585,295 | 12/1996 | Wu | 438/305 |
| 5,599,725 | 2/1997 | Dorleans et al. | 438/305 |
| 5,654,218 | 8/1997 | Lee | 438/303 |

OTHER PUBLICATIONS

Tiao–Yuan Huang et al., *A New LDD Transistor with Inverse–T Gate Structure*, 1987 IEEE, pp. 151–153, No Month.

Hyunsang Hwang et al., *Performance and Reliability Optimization of Ultra Short Channel CMOS Device for Giga–bit DRAM Applications*, 1995 IEEE, pp. 435–438, No Month.

Mizuki Ono et al., *Sub–50 NM Gate Length N–Mosfets with 10 NM Phosphorus Source and Drain Junctions*, 1993 IEEE, pp. 119–122, No Month.

*Primary Examiner*—Mary Wilczewski
*Attorney, Agent, or Firm*—Harness, Dickey & Pierce, P.L.C.

[57] ABSTRACT

A method for forming an ultra-short channel device with an inverse-T gate lightly-doped drain (ITLDD) structure is disclosed. The method includes forming a silicon layer (14) over a semiconductor substrate (10), and forming a dielectric layer (16) on the silicon layer. Next, a sacrificial region (18) is formed on the dielectric layer to define a gate region. A portion of the sacrificial region is oxidized to form a oxide layer (22) in the sacrificial region and along sidewalls and top surface of the sacrificial region, wherein at least a portion of the sacrificial region is unoxidized. The dielectric layer and a portion of the silicon layer are then removed using the oxide layer as a mask, thereby forming a step in the silicon layer. After removing the oxide layer, the silicon layer is removed using the unoxidized sacrificial region and the dielectric layer as a mask, thereby resulting in an inverse-T structure in the silicon layer. Finally, the substrate is implanted though the inverse-T structure, thereby forming the inverse-T gate lightly-doped drain (ITLDD) structure.

14 Claims, 4 Drawing Sheets

METHOD FOR FORMING A SEMICONDUCTOR DEVICE WITH AN INVERSE-T GATE LIGHTLY-DOPED DRAIN STRUCTURE

BACKGROUND OF THE INVENTION

1. Field of the Invention

The present invention relates to a semiconductor transistor, and particularly, to a method for forming an ultra-short channel metal-oxide-semiconductor field effect transistor (MOSFET) with an inverse-T gate lightly-doped drain (ITLDD) structure.

2. Description of the Prior Art

Metal-oxide-semiconductor (MOS) devices with ultra-short (less than 0.1 $\mu$m) channels are required for high frequency operation, for example, in a high-speed ring oscillator. The major constraints for 0.1 $\mu$m (or less) gate length metal-oxide-semiconductor field effect transistor (MOSFET) devices used, for example, in giga-bit dynamic random access memories (DRAMs) are short channel effect and hot carrier reliability problems. To solve these problems some process techniques such as ultra-shallow junction and ultra-thin gate oxide are used. For example, a device design window of process conditions such as oxide thickness, punch-through doses, and lightly-doped drain (LDD) doses is disclosed in Hyunsang Hwang et al., "Performance and Reliability Optimization of Ultra Short Channel CMOS Device for Giga-bit DRAM Applications," IEEE IEDM Tech. Dig., pages 435–438 (1995) which is hereby incorporated by reference.

However, it becomes difficult to define a gate length below 0.1 $\mu$m due to some practical limitations, such as the resolution, under current optical photolithography technique. In order to circumscribe this situation, a resistor-thinning process based on an isotropic plasma resist ashing technique is applied in forming short channel MOSFETs with the gate length below 0.1 $\mu$m as disclosed in Mizuki Ono et al., "Sub-50 nm Gate Length N-MOSFETs with 10 nm Phosphorus Source and Drain Junctions," IEEE IEDM Tech. Dig., pages 119–122 (1993) which is also hereby incorporated by reference.

When the MOSFET devices are operated at a low supply voltage, the parasitic resistance effect due to the lightly-doped drain (LDD) structure should be reduced to maintain their performance. Further, the peak field location under the gate should be properly controlled, so that the hot carrier effect germane to the LDD structure can be improved. An inverse-T lightly-doped drain (ITLDD) transistor structure is disclosed in Tiao-Yuan Huang et al., "A New LDD Transistor with Inverse-T Gate Structure," IEEE Electronic Device Letters, VOL. EDL-8. No. 4, pages 151–153 (1987) which is hereby incorporated by reference. Although this ITLDD structure can alleviate hot carrier effect, its process is still not suitable for high-density or high-speed circuit application, in which fabrication of ultra-short channel devices with gate length less than 0.1 $\mu$m is required.

SUMMARY OF THE INVENTION

In accordance with the present invention, a method is provided for forming an ultra-short channel MOSFET with an inverse-T gate lightly-doped drain (ITLDD) structure. In one embodiment, a first silicon oxide layer is formed on a semiconductor substrate, and an undoped silicon layer is formed on the first silicon oxide layer. Also, a silicon nitride layer is formed on the undoped silicon layer, and a doped polysilicon layer is formed on the silicon nitride layer. The doped polysilicon layer is then patterned to form a polysilicon region on the silicon nitride layer to define a gate region, followed by oxidizing a portion of the doped polysilicon region to form a polyoxide layer in the polysilicon region and along the sidewalls and top surface of the polysilicon region, at least a portion of the polysilicon region being unoxidized. Next, the silicon nitride layer and a portion of the undoped silicon layer are removed using the polyoxide layer as a mask, thereby forming a step in the undoped silicon layer. After removing the polyoxide layer, the silicon nitride layer is removed using the unoxidized doped polysilicon layer as a mask. The undoped silicon layer is etched back using the silicon nitride layer as a mask, thereby resulting in an inverse-T structure in the undoped silicon layer. Subsequently, the substrate is implanted through the inverse-T structure, thereby forming a lightly-doped drain structure in the substrate, followed by forming a second silicon oxide layer over the inverse-T structure and the substrate. Further, the second silicon oxide layer and the first silicon oxide layer are etched back until the substrate is exposed, thereby forming a spacer on sidewalls of the inverse-T structure and the first silicon oxide layer. After a conductive layer is formed on the top surface of the inverse-T structure and on the substrate, the inverse-T structure and the substrate are implanted through the conductive layer. Finally, the conductive layer is annealed to form silicide regions on the top surface of the inverse-T structure and on the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
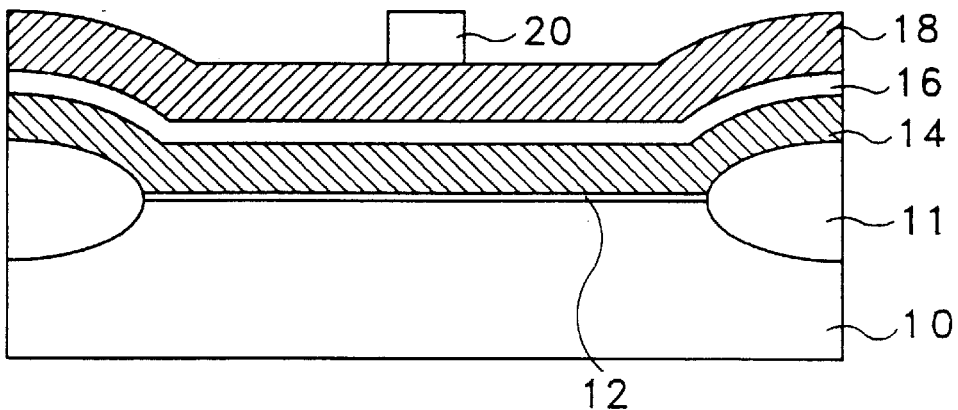
FIGS. 1–11 show cross-sectional views illustrative of various stages in the fabrication of an ultra-short channel MOSFET with an inverse-T gate lightly-doped drain (ITLDD) structure in accordance with the present invention.

FIG. 1 shows a cross-sectional view illustrative of a portion of a semiconductor substrate 10 having field oxide regions 11 thereon in accordance with one embodiment of the present invention, wherein a thin gate oxide layer 12 having a thickness of about 15–150 angstroms is grown on the substrate 10, for example, in a conventional thermal furnace. Next, a polysilicon layer 14, such as an undoped polysilicon layer, amorphous silicon layer or stacked silicon layers, is deposited on the gate oxide layer 12, and is used for forming a portion of a gate structure, which will become clear after the embodiment is described in detail. In this embodiment, this polysilicon layer 14 is preferably deposited using a conventional low pressure chemical vapor deposition (LPCVD). The thickness of this polysilicon layer 14 can range from about 1000 to 3000 angstroms.

Still referring to FIG. 1, a dielectric cap layer 16, such as a silicon nitride layer, is formed over the polysilicon layer 14 to a thickness of about 100 to 1000 angstroms. In this embodiment, the silicon nitride layer 16 is deposited using a conventional low pressure chemical vapor deposition (LPCVD) or plasma enhanced chemical vapor deposition (PECVD). A sacrificial semiconductor layer 18 is formed on the silicon nitride layer 16. In this embodiment, n+ doped polysilicon is preferably chosen as the material of this sacrificial layer 18, and is deposited using a standard chemical vapor deposition process to a thickness of about 500–3000 angstroms.

Figure 2:
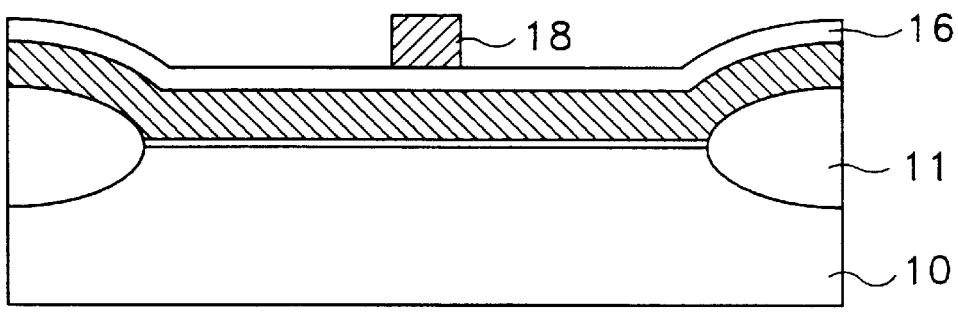

A photoresist layer 20 is then formed and patterned on the doped polysilicon layer 18 using conventional photolithography techniques, thereby defining a gate region in the doped polysilicon layer 18 after the doped polysilicon layer 18 is etched back as shown in FIG. 2.

Figure 3:
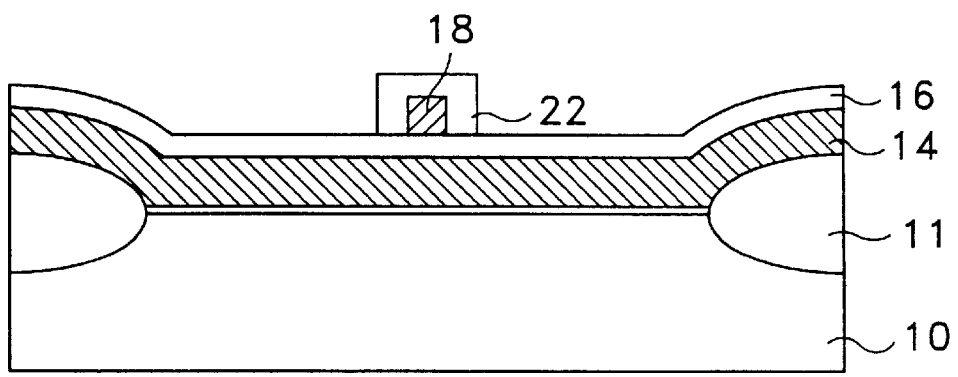

The patterned doped polysilicon layer 18 is then subjected to, for example, a low temperature (about 700°–950° C.) steam oxidation process to oxidize the doped polysilicon layer 18, forming a thermal polyoxide layer 22 into the doped polysilicon layer 18 along the sidewalls and top surface of the doped polysilicon layer 18 as shown in FIG. 3.

Figure 4:
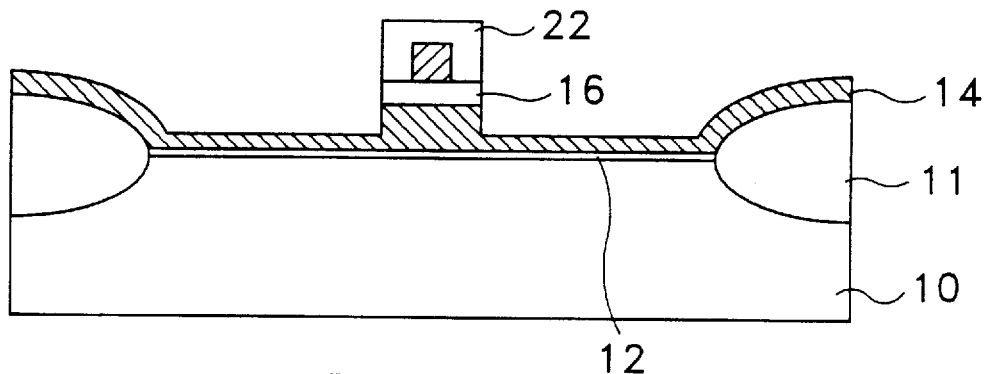

Using the thermal polyoxide layer 22 as a mask, the silicon nitride layer 16 is etched, and the undoped polysilicon layer 14 is partially etched, forming a cross section as shown in FIG. 4.

Figure 5:
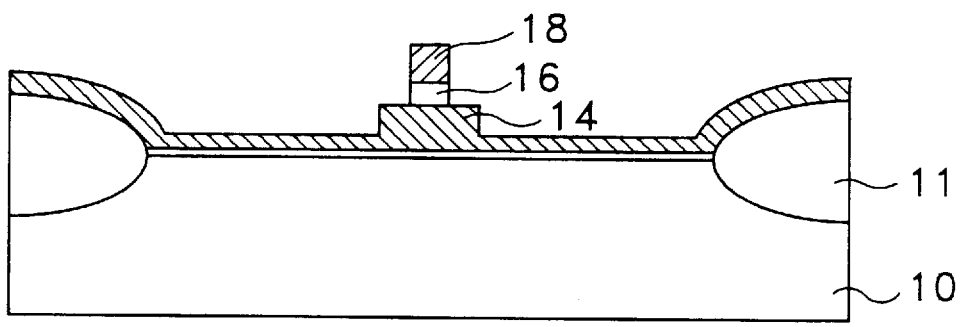
Figure 6:
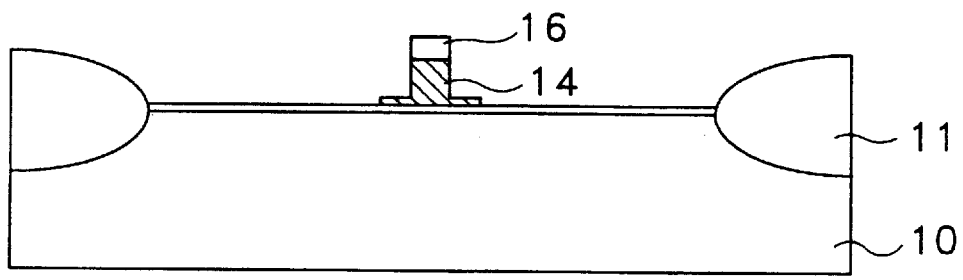
Figure 7:
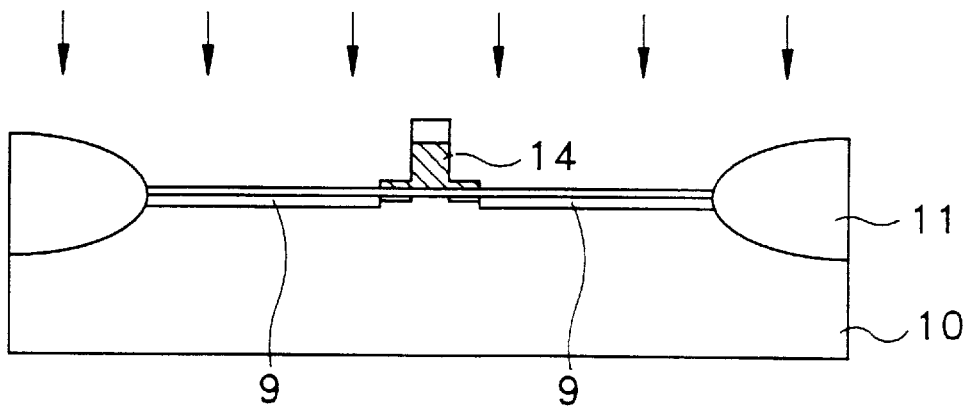

The thermal polyoxide layer 22 is then removed, for example, by diluted hydrofluoric (HF) solution or buffered oxide etch (BOE), wherein the remaining undoped polysilicon layer 14 is used to protect the field oxide regions 11 and the gate oxide layer 12 from being effected. Subsequently, the silicon nitride layer 16 is etched using the doped polysilicon layer 18 as a mask, resulting in the cross section shown in FIG. 5. The formed silicon nitride layer 16 is further used as a mask to etch the undoped polysilicon layer 14, resulting in an inverse-T gate structure as shown in FIG. 6. The substrate 10 is then subjected to an ion implantation through the inverse-T gate structure, forming source/drain region 9 having a lightly-doped drain profile in the substrate 10 as shown in FIG. 7.

Figure 8:
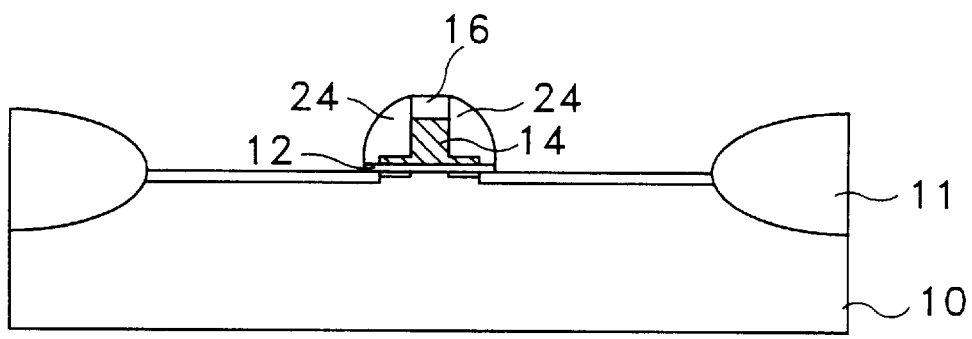

Referring to FIG. 8, a spacer 24 is formed on the sidewalls of the silicon nitride layer 16, the undoped polysilicon layer 14, and the gate oxide layer 12. In this embodiment, silicon oxide is chosen as the material of the spacer 24. This oxide spacer 24 is preferably formed by first blanket depositing a silicon oxide layer 24 by a chemical vapor deposition (CVD) over the structure of FIG. 7, followed by etching back this silicon oxide layer 24.

Figure 9:
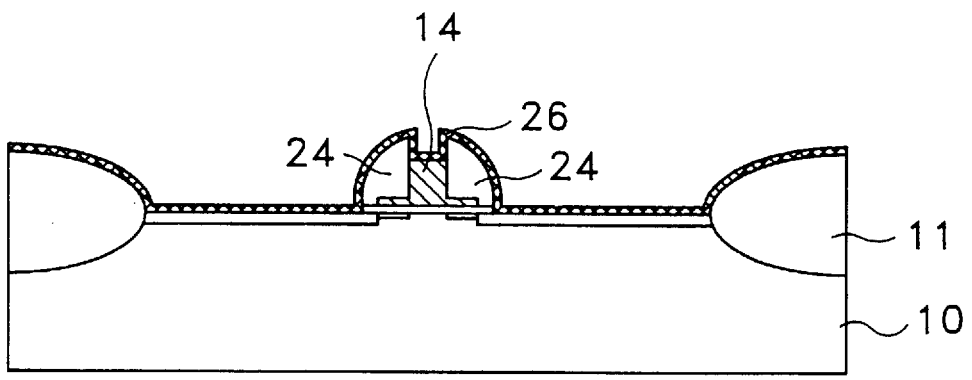

In FIG. 9, after the silicon nitride layer 16 is removed, a metal layer 26, such as Ti, Co, Pt, Ni, Cr, W, or Pd, is deposited over the exposed substrate 10, the spacer 24, and the undoped polysilicon layer 14 by sputtering or chemical vapor deposition (CVD).

Figure 10:
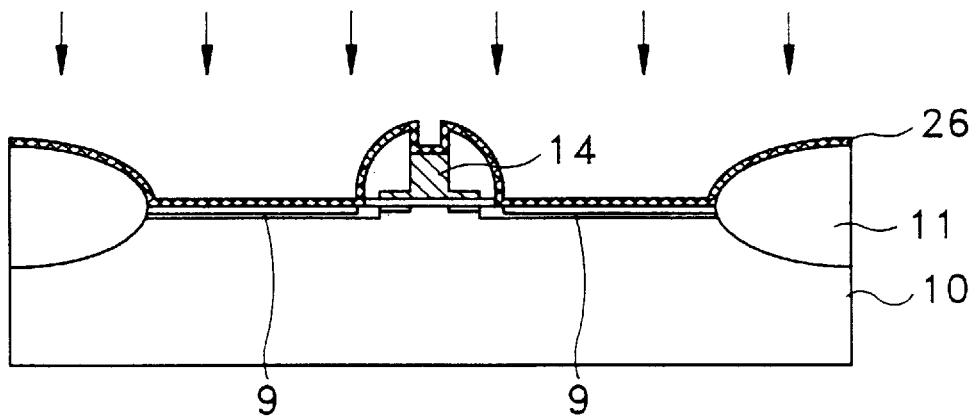

Referring to FIG. 10, the gate region in the undoped polysilicon layer 14, and the source/drain region 9 in the substrate 10 are then doped by a high dose (about $10^{14}$–$10^{16}$ atoms/cm$^2$) implant through the metal layer 26.

Figure 11:
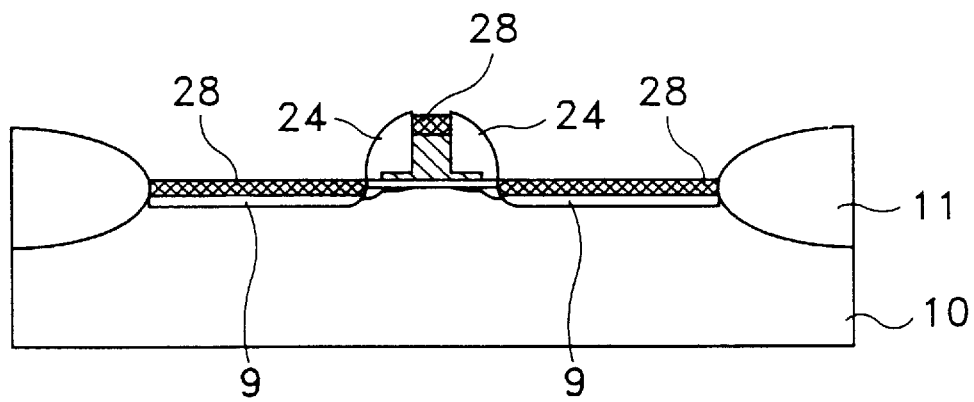

To complete the present invention, an annealing process is performed to form silicide regions 28 over the gate region 14 and source/drain region 9, therefore forming an ultra-short channel salicided MOSFET with an inverse-T gate lightly-doped drain (ITLDD) structure as shown in FIG. 11. In this embodiment, the annealing process is preferably a conventional two-step rapid thermal process (RTP). It is noted that the oxide spacer 24 previously formed in connection with FIG. 8 is used in the resultant MOSFET structure to prevent the silicide region 28 on the gate 14 from being electrically bridged to the silicide region 28 on the source/drain 9. It is appreciated that the term "ultra-short" in this specification is commonly used in the semiconductor industry to refer to a channel width in the range of about 4–100 nm.

Although specific embodiments have been illustrated and described, it will be obvious to those skilled in the art that various modifications may be made without departing from the spirit which is intended to be limited solely by the appended claims.

What is claimed is:

1. A method for forming a semiconductor device with an inverse-T gate lightly-doped drain (ITLDD) structure, said method comprising:

forming a silicon layer over a semiconductor substrate;

forming a dielectric layer on said silicon layer;

forming a sacrificial region on said dielectric layer, said sacrificial region defining a gate region;

oxidizing a portion of said sacrificial region to form an oxide layer in said sacrificial region and along the sidewalls and top surface of said sacrificial region, at least a portion of said sacrificial region being unoxidized;

removing said dielectric layer and a portion of said silicon layer using said oxide layer as a mask, thereby forming a step in said silicon layer;

removing said oxide layer;

removing said silicon layer using said unoxidized sacrificial region and said dielectric layer as a mask, thereby resulting in an inverse-T structure in said silicon layer; and implanting said substrate though the inverse-T structure, thereby forming the inverse-T gate lightly-doped drain (ITLDD) structure.

2. The method according to claim 1, further comprising forming a silicon oxide layer on said substrate before forming said silicon layer.

3. The method according to claim 1, wherein said dielectric layer comprises silicon nitride.

4. The method according to claim 1, wherein said sacrificial region comprises doped silicon.

5. The method according to claim 1, further comprising:

forming a spacer on the sidewalls of said inverse-T structure;

forming a metal layer on the top surface of said inverse-T structure and on said substrate; and annealing said metal layer to form silicide contact regions on the top surface of said inverse-T structure and on said substrate.

6. The method according to claim 1, wherein said silicon layer comprises polysilicon.

7. The method according to claim 1, wherein said silicon layer comprises amorphous silicon.

8. A method for forming a semiconductor device with an inverse-T gate lightly-doped drain (ITLDD) structure, said method comprising:

forming a first silicon oxide layer on a semiconductor substrate;

forming an undoped silicon layer on said first silicon oxide layer;

forming a silicon nitride layer on said undoped silicon layer;

forming a doped polysilicon layer on said silicon nitride layer;

patterning said doped polysilicon layer to form a polysilicon region on said silicon nitride layer, said polysilicon region defining a gate region;

oxidizing a portion of said doped polysilicon region to form a polyoxide layer in said polysilicon region and along the sidewall and top surface of said polysilicon region, at least a portion of said polysilicon region being unoxidized;

removing said silicon nitride layer and a portion of said undoped silicon layer using said polyoxide layer as a mask, thereby forming a step in said undoped silicon layer;

removing said polyoxide layer;

removing said silicon nitride layer using said unoxidized doped polysilicon layer as a mask;

etching back said undoped silicon layer using said silicon nitride layer as a mask, thereby resulting in an inverse-T structure in said undoped silicon layer;

implanting said substrate though the inverse-T structure, thereby forming a lightly-doped drain structure in said substrate;

forming a second silicon oxide layer over said inverse-T structure and said substrate;

etching back said second silicon oxide layer and said first silicon oxide layer until said substrate is exposed, thereby forming a spacer on the sidewalls of said inverse-T structure and said first silicon oxide layer;

forming a conductive layer on the top surface of said inverse-T structure and on said substrate;

implanting said inverse-T structure and said substrate through said conductive layer; and annealing said conductive layer to form silicide regions on the top surface of said inverse-T structure and on said substrate.

9. The method according to claim 8, wherein said polyoxide layer is formed by a thermal oxidation.

10. The method according to claim 8, wherein said conductive layer comprises metal.

11. The method according to claim 10, wherein said metal is formed by sputtering.

12. The method according to claim 8, wherein said conductive layer is annealed by a rapid thermal process.

13. The method according to claim 8, wherein said undoped silicon layer comprises polysilicon.

14. The method according to claim 8, wherein said undoped silicon layer comprises amorphous silicon.

* * * * *